(12) United States Patent
Talbot et al.

(10) Patent No.: US 6,225,626 B1
(45) Date of Patent: *May 1, 2001

(54) THROUGH-THE-SUBSTRATE INVESTIGATION OF FLIP CHIP IC'S

(75) Inventors: Christopher Graham Talbot, Emerald Hills; James Henry Brown, San Jose, both of CA (US)

(73) Assignee: Schlumberger Technologies, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/163,710

(22) Filed: Sep. 30, 1998

Related U.S. Application Data

(63) Continuation of application No. 08/811,104, filed on Mar. 3, 1997, now Pat. No. 5,821,549.

(51) Int. Cl.$^7$ .................................................. H01J 37/30
(52) U.S. Cl. .................. 250/307; 309/491.1; 309/452.21
(58) Field of Search ................................. 250/307, 491.1, 250/492.21, 309

(56) References Cited

U.S. PATENT DOCUMENTS

| 4,900,695 | * | 2/1990 | Takahashi et al. ................. 437/195 |
| 5,493,236 | * | 2/1996 | Ishi et al. ............................ 324/752 |
| 5,561,293 | * | 10/1996 | Peng et al. .......................... 250/307 |

* cited by examiner

Primary Examiner—Bruce C. Anderson
(74) Attorney, Agent, or Firm—Bruce D. Riter; Danita J. M. Maseles

(57) ABSTRACT

Methods are provided for exposing a selected feature of an IC device, such as a selected conductor, from the back side of the substrate without disturbing adjacent features of the device, such as active regions. One such method comprises: (a) determining a region of the IC device in which the selected feature is located; (b) acquiring from the back side of the substrate an IR optical microscope image of the region; (c) aligning the IR optical microscope image with a coordinate system of a milling system; and (d) using structures visible in the IR optical microscope image as a guide, operating the milling system to expose the selected feature from the back side of the IC device without disturbing adjacent features.

17 Claims, 9 Drawing Sheets

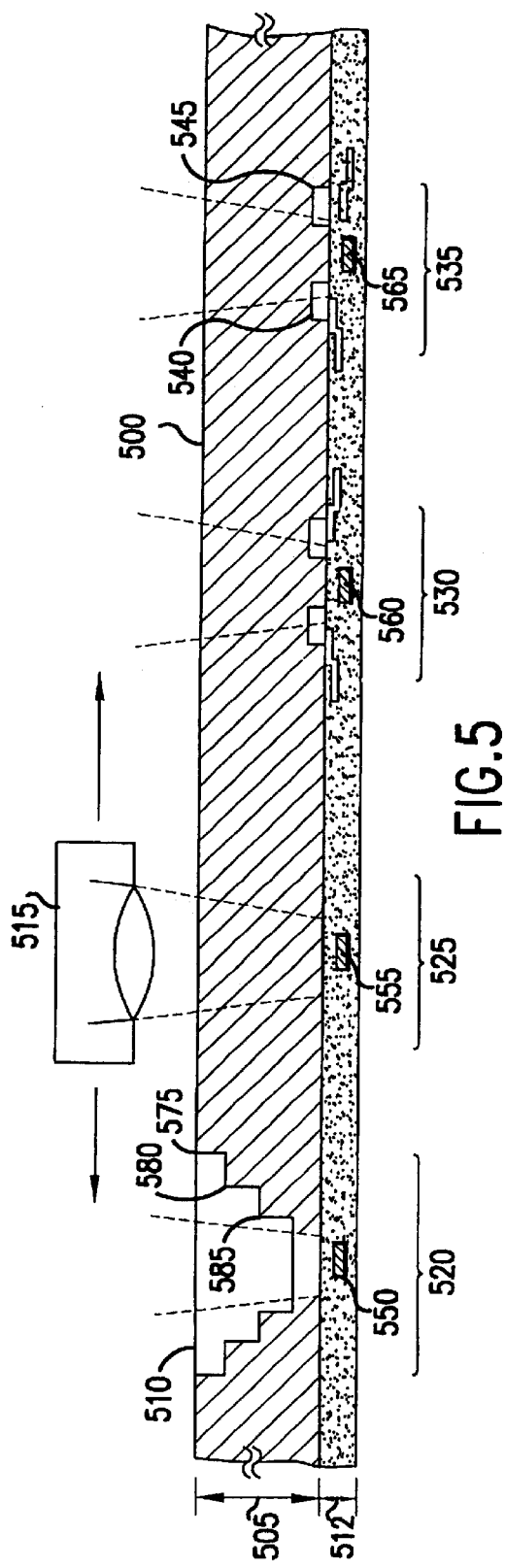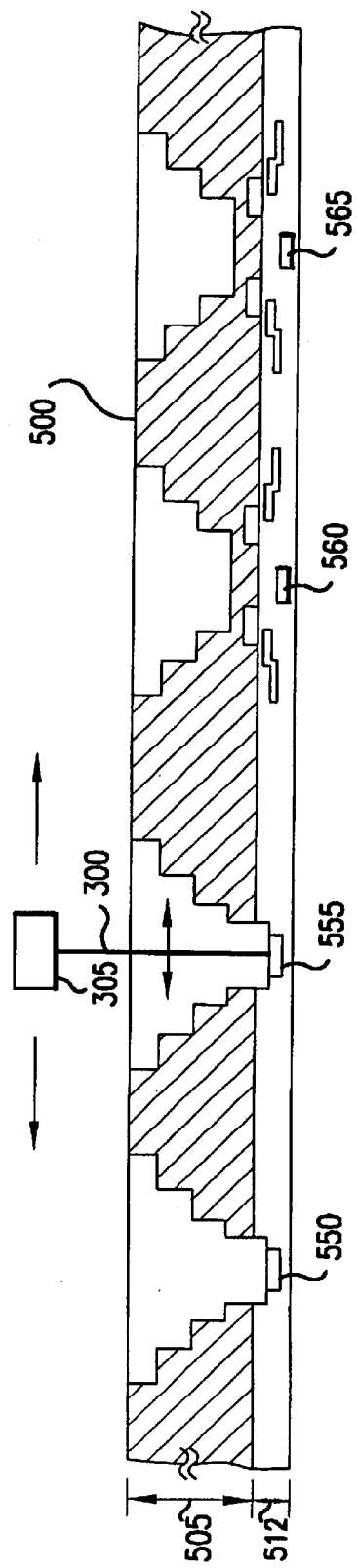

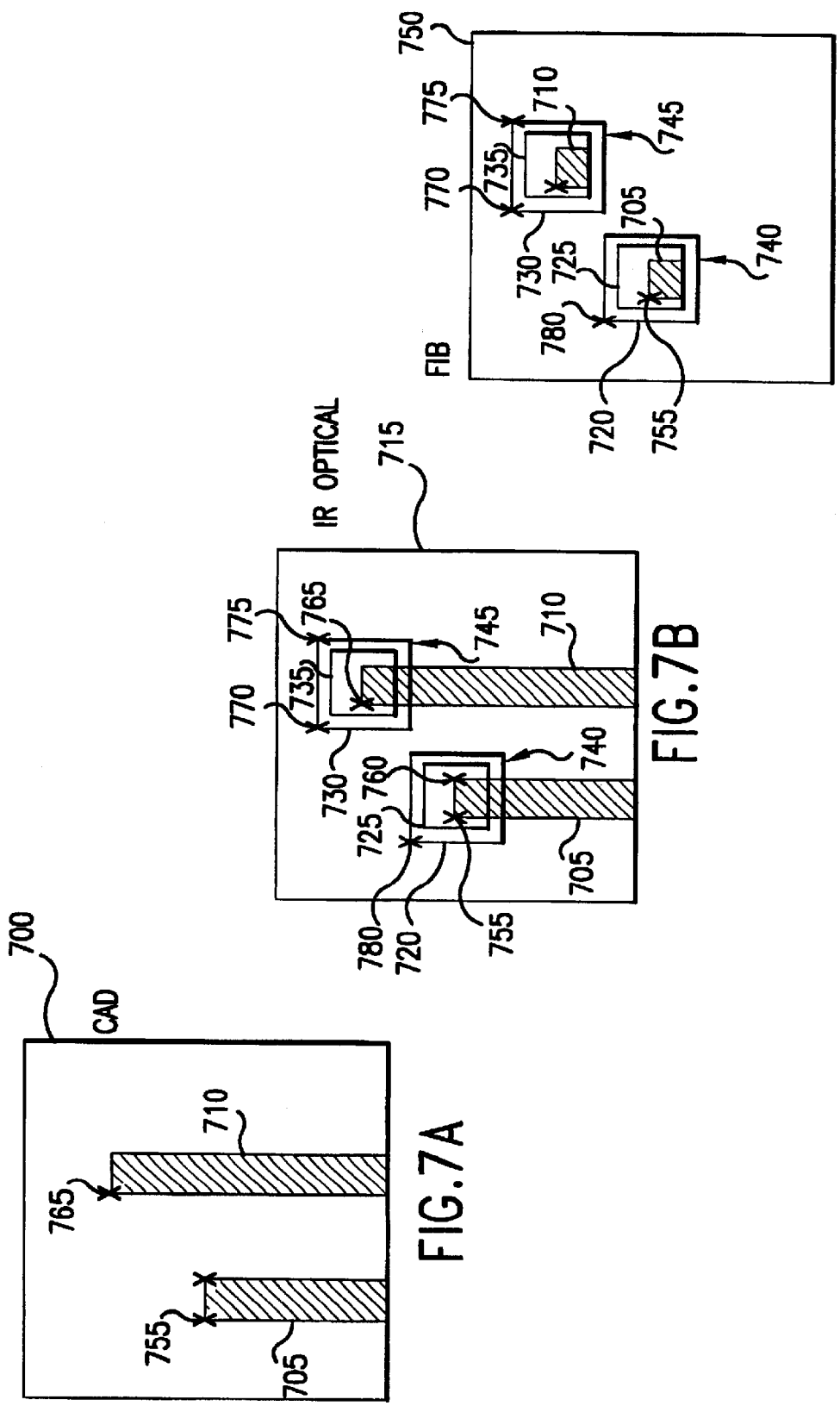

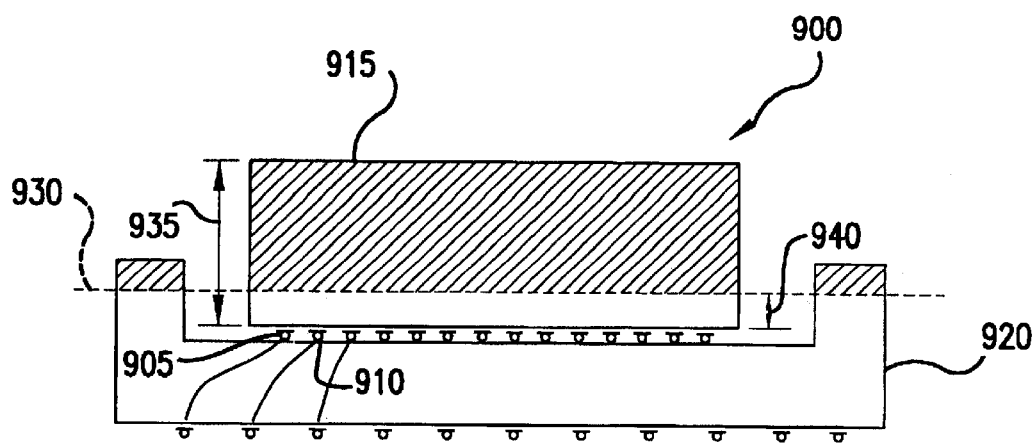
FIG.9
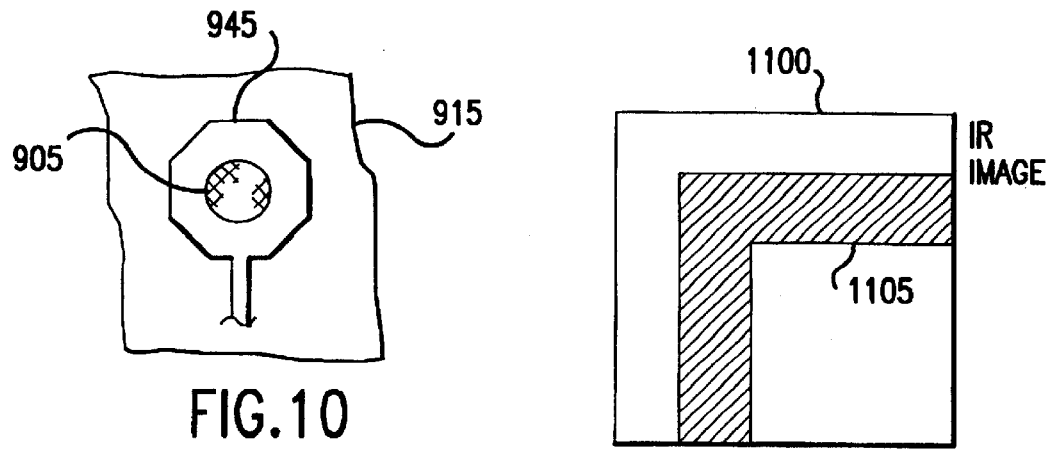
FIG.10
FIG.11A
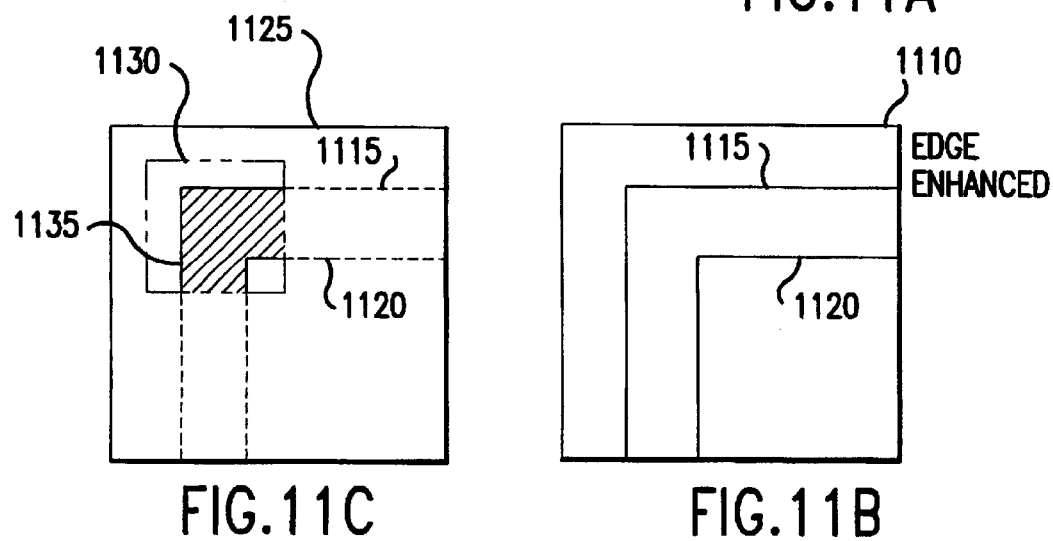
FIG.11C
FIG.11B

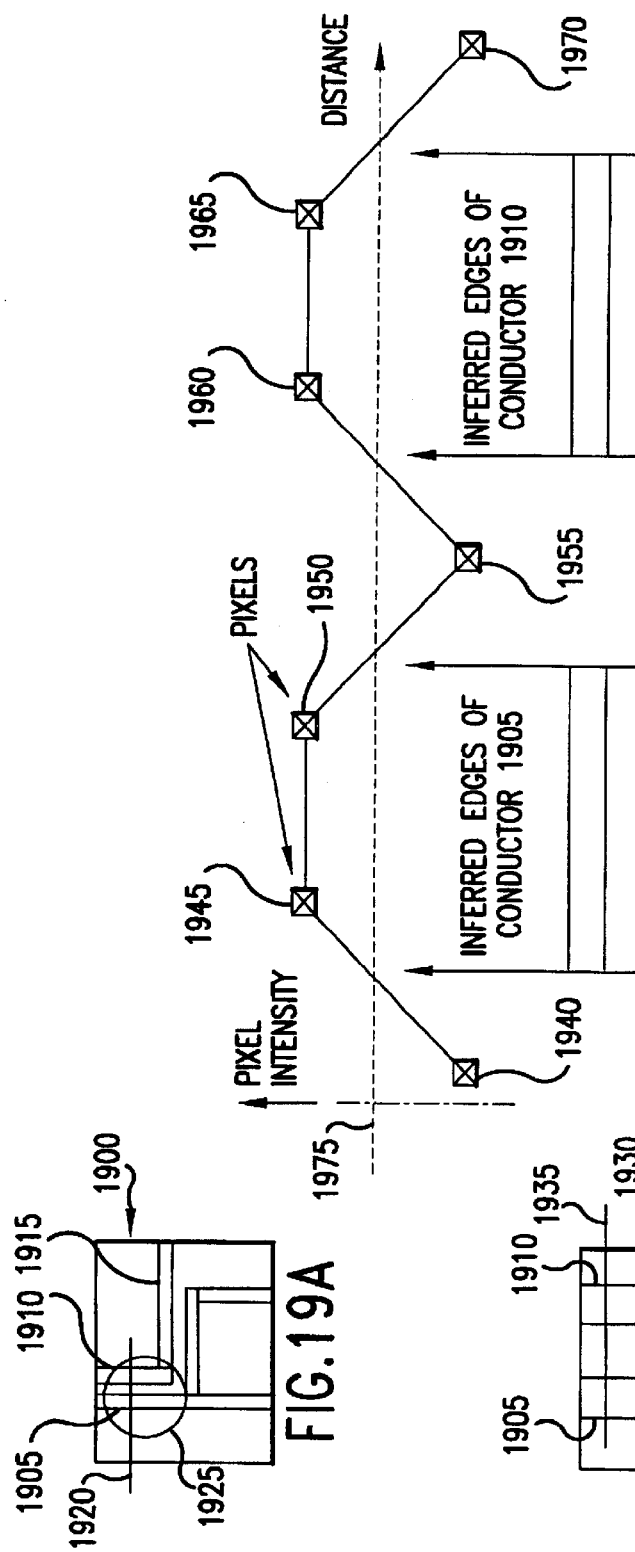

THROUGH-THE-SUBSTRATE INVESTIGATION OF FLIP CHIP IC'S

This is a continuation of U.S. application Ser. No. 08/811,104, filed Mar. 3, 1997, now U.S. Pat. No. 5,821,549 granted Oct. 13, 1998.

BACKGROUND OF THE INVENTION

1. Field of the Invention

The present invention relates to methods and apparatus for exposing conductors of an IC (integrated circuit) device through the substrate to aid in debug and/or failure analysis.

2. The Prior Art

Exposing conductors of an IC device for failure analysis, debug, and even repair, has become commonplace. Typically, a FIB (focused ion beam) is used to mill away material to expose the conductor, sometimes with the introduction of a halogen-containing compound to enhance the milling rate. Conductors are cut, and conductive material is deposited, to effect circuit modifications or to construct probe pads. The IC device is stimulated to produce signals on the exposed conductors and probe pads, and these signals are detected using the FIB as a probe or using an electron-beam probe or mechanical probe.

Navigation tools are available to assist in locating the conductor portion to be exposed. For example, a FIB system commercially available as the "IDS P2X" (Probe Point extension) system from Schlumberger Technologies, Inc., San Jose, Calif., provides software-based navigation tools in which the CAD layout and live FIB images of the device can be registered to one another. Once registered, these images are linked so that when the user selects a point or feature on one of the images the corresponding location is identified on the other image. For example, a buried conductor which is not visible on the FIB image can be identified on the CAD layout image in order to position a "FIB operation box" which defines an area where the FIB is to be scanned for milling. FIB milling in this area exposes precisely the portion of the conductor of interest, without damage to surrounding structure of the IC device. Selective gas-enhanced milling and suitable end-point detection allow the milling to be stopped before damaging the exposed conductor portion.

Such processes have heretofore generally been carried out from the "front side" of the device—from the side of the substrate on which the layers defining the circuit are fabricated. An initial FIB image of the front side of the device contains information about the location of device structure which is used to register the FIB image to the stored layout data from which the CAD image is prepared. For example, bond pads or fiducial marks visible on the front side of the device indicate the registration of the top device layer. Since the buried device layers are aligned with the top device layer within some margin of offset error, features visible on the top layer are used for registration.

Navigation techniques are also known in which one image of the device, such as an optical image or SEM (scanning electron microscope) image, is used as an overlay on a SIM (scanning ion microscope) image of the device to assist in directing a FIB to expose a buried feature. See, for example, U.S. Pat. No. 4,683,378 to Shimase et al. When there is not enough unique surface information near the FIB operation area to align the images, the imaging area of the FIB can be deflected to permit alignment over a much larger area, while maintaining the needed resolution and accuracy. See U.S. Pat. No. 5,401,972 to Talbot et al. Yet another approach is to use a high-accuracy stage to navigate the FIB from fiducial information on the metal layer of the device. Such stages are costly, requiring a laser interferometer for determining position, and accuracy is limited by thermal mechanical drift and FIB drift.

Such techniques are suitable for devices which are accessible from the front side, such as those designed for conventional packaging of the type having bond pads around the periphery and having the central portion of the device unobstructed by contacts or package leads. However, increased device operating speeds demand lower impedances and thus shorter connections from active elements of the device to the package leads. At the same time, larger and more complex devices call for an increased number of input/output connections, resulting in unacceptably large die and packages. A response to these needs has been the development of so-called "flip-chip" ("C4") packaging in which the bond connections are arrayed over the entire front side of the IC device and these align with a corresponding array of bond connections on the package. Solder "bumps" electrically connect the bond connections of the device with those of the package. The connection length and impedance from active element to package pin are reduced, and the number of connections per unit area of device and package are increased, relative to the peripheral-connection arrangements of the past.

A disadvantage of the "flip-chip" packaging arrangement is that the top layer of the device is covered with an array of bond pads, making access to buried conductors difficult or impossible even with unpackaged devices. For packaged devices, the package covers the entire front side of the device so that there can be no chance of accessing buried conductors from the front side. Improved techniques are needed for debug of such devices.

Another consequence of increasingly complex devices is the need to reduce line widths and increase the number of layers. "Flip-chip" devices now in fabrication are using 0.35 $\mu$m design rules, with still more advanced design rules of 0.20 $\mu$m and below expected before long. As line widths decrease and the number of layers increases, layer-to-layer registration becomes more of a problem. CAD layout data shows the ideal layer-to-layer registration, but the fabricated devices will have some misregistration. The more layers involved, the greater the cumulative registration error ("stack-up" error). Smaller design rules and stack-up error together increase the chance of missing a conductor of interest or of inadvertently damaging the device when conducting FIB operations.

Techniques are known for failure-analysis investigation of IC devices through the substrate, from the "back side," though none has adequately addressed the need for debug of "flip-chip" devices. One approach is to acquire IR (infrared) optical microscope images through the silicon substrate, given that silicon is transparent at wavelengths in the range of about 0.9 $\mu$m to about 1.9 $\mu$m. See, for example, J. BROWN, *Failure analysis of plastic encapsulated components—the advantages of IR microscopy*, J. MICROSCOPY, Vol. 148, Pt. 2, November 1987, pp. 179–194.

Failure analysis on "flip-chip" devices typically starts with software simulation and external testing to localize the failure. An IR laser can then be shined through the back side of the device to inject light into the active region of a transistor of interest. If the transistor was already on, there is no change. If the transistor was off, the IR beam induces a leakage current which may be detected on the external pins of the device. This OBIC ("optical beam-induced current) technique permits logic analysis, but does not give any timing information.

An electro-optic probing technique is also known in which an IR laser is pulsed and the change of propagation delay is measured as a function of carrier density. This technique gives a direct measure of how quickly the transistor is switching and of its state. While effective for bipolar devices, it does not work well with CMOS devices due to low carrier density change. This makes it unsuitable for the long duty-cycle measurements needed for microprocessor debug.

A destructive technique suitable only for failure analysis is to delaminate the device layer by layer. Rather than performing a functional analysis, the structure is examined for functionality of individual cells or elements of a cell. By testing and simulation it is often possible to pre-localize the fault to some 10 or 100 or 1000 nets, and then examine whether the nets connect together as they should. If an open via or non-functional transistor is found, then the problem may have been identified. This technique is not suitable for debug, as it does not allow detection of signals on the nets as the device is operated, nor does it allow repair of defective nets.

Another approach is to first construct and debug individual cells using conventional front-side techniques. These pre-tested cell designs are then used to produce a flip-chip design and it is hoped that interconnections between the cells work as intended. If not, software instructions to the device are modified to simply avoid using the cells which do not perform as intended. The number of defective cells is minimized as best possible by thoroughly characterizing each aspect of the design and by extensive use of simulation. The simulation becomes more difficult and less effective as the electrical problems lie in faulty interconnections between cells rather than within the cells.

It is believed that some may have tried debug of "flip-chip" devices by thinning the substrate, then drilling holes through the thinned substrate to expose conductors for electron-beam probing. A problem with this approach arises from the ever-smaller design rules coupled with layer-to-layer stack-up error and the close proximity of active regions to conductors of interest. Drilling to expose a conductor of interest must be done without damaging the adjacent active regions if it is to be useful for design debug. This is difficult because of the lack of visible structure on the back side of the substrate which could be used to accurately determine where the buried conductor and the adjacent active regions are located. Damage to active regions can destroy the device or change its performance. Further, it is believed that a stage of higher accuracy than is now available will be required to successfully perform such operations on devices of current interest.

Improved techniques are needed to access conductors of a device through the back side of its substrate without damaging the device. Such techniques would enable probing with electron-beam, FIB, AFM (atomic force microscope) or mechanical probes and thus permit acquisition of accurate timing information needed for debug.

SUMMARY OF THE INVENTION

Preferred embodiments of the invention offer methods for exposing a selected feature of an IC device, such as a selected conductor, without disturbing adjacent features of the device, such as active regions. One such method in a device having a silicon substrate with a front side and a back side and having on the front side a plurality of structures defining said features comprises:

a. determining a region of the IC device in which the selected feature is located;

b. acquiring from the back side of the substrate an IR optical microscope image of the region;

c. aligning the IR optical microscope image with a coordinate system of a milling system; and d. using structures visible in the optical microscope image as a guide, operating the milling system to expose the selected feature from the back side of the IC device without disturbing adjacent features.

These and other features of the invention will become apparent to those of skill in the art from the following description and the accompanying drawing figures.

BRIEF DESCRIPTION OF THE DRAWING

FIG. 5 is a schematic cross-sectional view showing IR optical microscope imaging and laser thinning of the substrate of a device to identify alignment points and features of interest;

FIG. 6 is a schematic cross-sectional view showing FIB milling to expose features to be used as alignment points for further FIB milling in the device of FIG. 5;

FIG. 7A is CAD image of a portion of an IC device showing conductors of interest;

FIG. 7B is an IR optical image of a portion of the IC device of FIG. 7A showing conductors of interest and windows where the substrate has been thinned;

FIG. 7C is a FIB image of a portion of the IC device of FIG. 7A showing exposed portions of conductors of interest and windows where material has been removed by FIB milling;

FIG. 9 is a partial sectional view of a flip-chip packaged part, showing solder-bump connections from chip to package and showing portions to be removed for back side investigation in accordance with the invention;

FIG. 10 is a front view of a bond pad and solder bump of a flip-chip connection;

FIG. 11A is an IR optical microscope image of a portion of an IC device showing a conductor of interest;

FIG. 11B is an edge-enhanced version of the image of FIG. 11A;

FIG. 11C is a FIB image of the IC device portion of FIG. 11A on which the edge-enhanced image of FIG. 11B and a FIB operation box are overlaid to show where the device is to be milled to expose a conductor portion of interest;

FIGS. 19A–19C illustrate a method of sub-pixel interpolation for alignment of images of differing resolution.

DETAILED DESCRIPTION

A FIB system suitable for carrying out the FIB operations described below is the "IDS P2X" (Probe Point extension) system, available commercially from Schlumberger Technologies, Inc., of San Jose, Calif. A laser system suitable for carrying out the laser milling operations described below is the Silicon Editor™, available commercially from Revise, Inc., of Concord Mass. IR optical microscopes suitable for preparing IR optical images described below are commercially available, such as the LSM 310 Confocal Laser Scanning Microscope of Carl Zeiss USA Microscope Division and the KMS 300 Confocal Measuring System of Technical Instrument Company, Sunnyvale, Calif. Confocal microscopy allows the acquisition of an image with a very narrow focal plane. A series of such images from differing focal-plane depths can be used to visualize a structure which would otherwise be too deep to image properly.

Figure 1A:
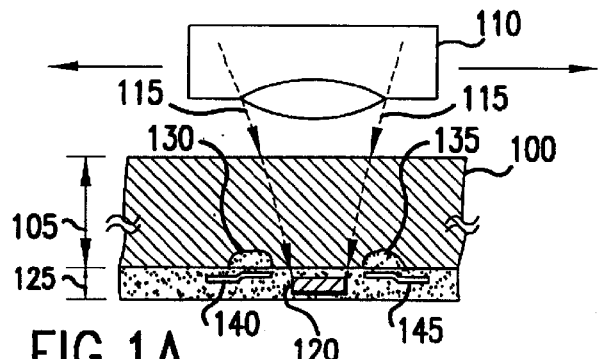
FIG. 1A is a schematic cross-sectional view showing acquisition of an IR optical microscope image through back side of a wafer or die.

FIG. 1A is a schematic, sectional view showing acquisition of an IR optical microscope image through the back side of an IC device on a wafer or die. After chemical or mechanical thinning of substrate 100 to a thickness 105 of about 100 $\mu$m to 200 $\mu$m, an IR optical microscope 110 shines IR light 115 through substrate 100 in the region of a feature of interest, such as conductor 120 contained in interconnected layer 125. During thinning, the substrate surface is preferably polished sufficiently to remove scratches and other surface irregularities which may be visible in an IR optical microscope image of the thinned region. Other structure of the IC device in the region of conductor 120, such as active regions 130 and 135 and gates 140 and 145 are also imaged. Wavelength of the IR light is preferably in the range of 0.9 $\mu$m to 1.9 $\mu$m, such as about 1.2 $\mu$m. Undoped silicon is transparent to light of such wavelengths.

Figure 1B:
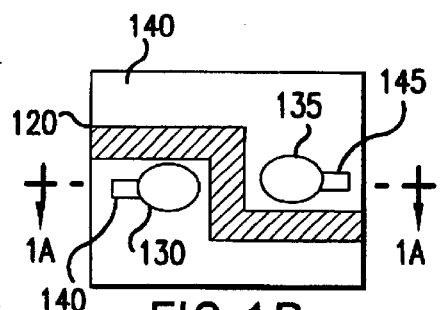
FIG. 1B shows an exemplary IR optical microscope image resulting from the acquisition of FIG. 1A.

FIG. 1B shows an exemplary IR optical microscope image 140 resulting from the operation of FIG. 1A. Visible in image 140 are conductor 120, active regions 130 and 135 and gates 140 and 145. The sectional view of FIG. 1A is taken along line 1A—1A of FIG. 1B. Such structural detail in the image can be used to align the image with the CAD layout data used to fabricate the IC device. Methods for alignment of images with CAD layout data are known, for example, from U.S. Pat. No. 5,054,097 to Flinois et al. See also European Patent Publication No. 0 619 551 A2 of Barnard (corresponding to U.S. patent application Ser. No. 31,547 filed Mar. 15, 1993). The Schlumberger IDS P2X system provides software tools for image alignment. For example, the IR optical microscope image can be scanned into a TIFF-format data file. When this file and the CAD layout data for the IC device are loaded into storage in an IDS P2X FIBstation, the IR optical microscope image can be readily aligned with the CAD layout data using the standard alignment tools of the P2X system. Image-alignment considerations are discussed in more detail below with reference to FIGS. 19A–19C.

Figure 2A:
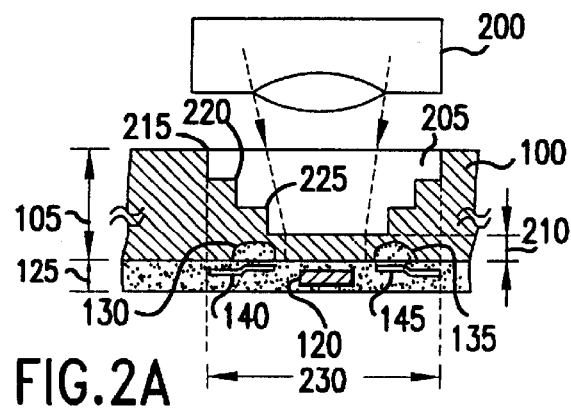
FIG. 2A is a schematic cross-sectional view showing laser thinning of the substrate from the back side of a device in a region of interest.

FIG. 2A is a schematic cross-sectional view showing laser thinning of substrate 100 from the back side of the IC device in the region of interest. A laser milling apparatus 200, such as a Silicon Editor™ Argon-ion laser system, is operated to cut a window 205 in silicon substrate 100 without penetrating into the layer 210 where active regions 130 and 135 could be damaged. Layer 210 has a typical thickness of about 10 $\mu$m. The laser beam can be scanned to produce sidewalls of window 205 having any number of steps, such as steps 215, 220 and 225. This further thinning of substrate 100 in the region of interest is preferably done with a laser system rather than with a FIB system due to the substantially higher material-removal rate of the laser system. The milling can be accelerated by introduction of a halogen or halogen-containing compound to assist material removal. A typical window dimension 230 might be 400 $\mu$m to produce a 400 $\mu$m by 400 $\mu$m window at the back surface of substrate 100. The precise dimensions are a matter of choice and will depend upon such factors as the geometry of features of interest, thickness 105 of thinned substrate 100, and the aspect ratio (height:width) of the opening needed for effective probing. The aspect ratio of an opening for electron-beam probing is typically 1:1.

Figure 2B:
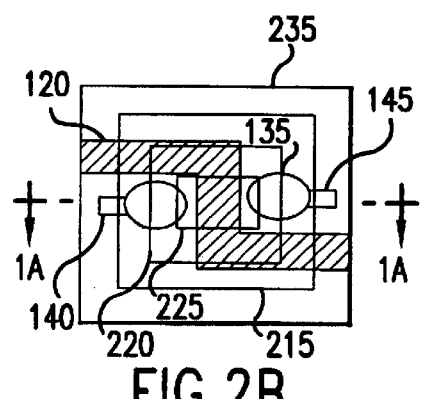
FIG. 2B shows an exemplary IR optical microscope image following laser thinning as in FIG. 2A.

FIG. 2B shows an exemplary IR optical microscope image 230 acquired following laser thinning as in FIG. 2A. In addition to the features visible in image 140 of FIG. 1B, the edges of steps 215, 220 and 225 are also visible. Because these edges will also be visible in a FIB image, IR optical microscope image 230 now contains information useful in navigating a FIB to the conductor of interest. The manner in which this information is used will be described in more detail below. The sectional view of FIG. 2A is taken along line 2A—2A of FIG. 2B.

Figure 3A:
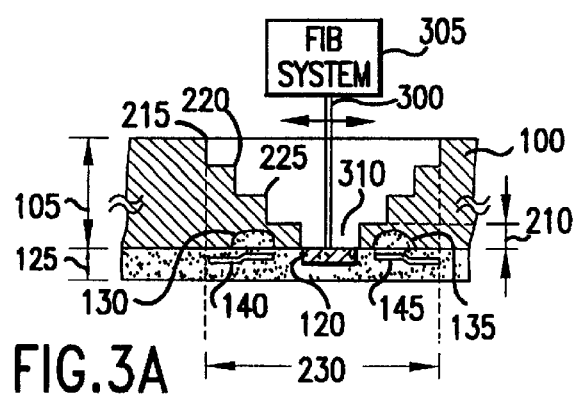
FIG. 3A is a schematic cross-sectional view showing FIB milling to expose a feature of interest.

FIG. 3A is a schematic, sectional view showing FIB milling of the IC device to expose the feature of interest. After using information from IR microscope image 230 and a FIB image for alignment as described below, FIB 300 of a FIB system 305 is scanned to mill a deeper window portion 310 through the active-region layer 210 to expose conductor 120. Using the information from IR microscope image 230 to align the FIB system allows FIB 300 to be precisely navigated so as to mill directly to conductor 120 without disturbing active regions 130 and 135 or gates 140 and 145. FIB milling can advantageously be enhanced by introducing a suitable halogen or halogen-containing compound during the operation. For example, it is known to introduce $XeF_2$ to selectively enhance the milling rate of silicon relative to the milling rate of Aluminum. The operation proceeds more quickly, while damage to conductor 120 is minimized. Conventional end-point detection techniques are used to stop the FIB milling when conductor 120 has been exposed.

Figure 3B:
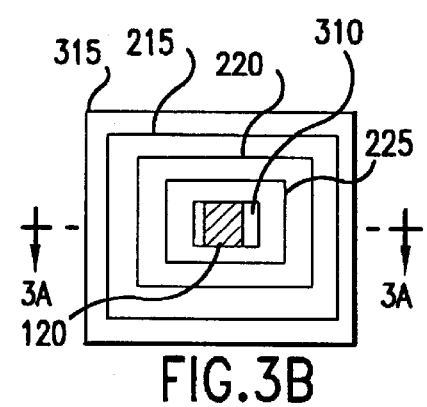
FIG. 3B shows an exemplary FIB image following milling as in FIG. 3A.

FIG. 3B shows an exemplary FIB image 315 acquired following FIB milling as in FIG. 3A. Window portion 310 milled with the FIB has exposed conductor 120 for probing, but active regions 130 and 135 and gates 140 and 145 remain undisturbed. The sectional view of FIG. 3A is taken along line 3A—3A of FIG. 3B.

Figure 4A:
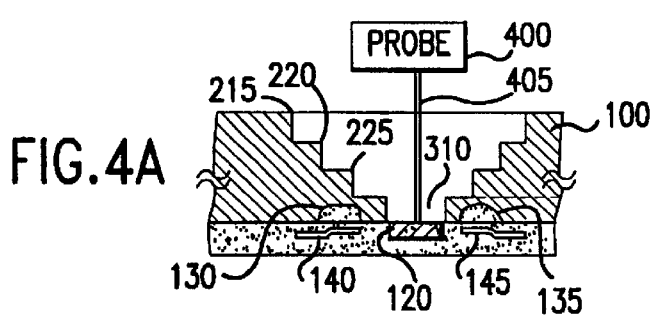
FIG. 4A is a schematic cross-sectional view showing probing of an exposed feature of interest after FIB milling as in FIG. 3A.

FIG. 4A is a schematic, sectional view showing probing of an exposed feature of interest after FIB milling as in FIG. 3A. A probe system 400 having a probe 405 is operated to detect a signal appearing on conductor 120 as the IC device is stimulated. Probe system 400 can be a mechanical probe system, an AFM (atomic force microscope) probe system, and electron-beam probe system, or a FIB system. Thus, probe 405 may be mechanical or may be a focused particle beam (electron beam or FIB) which interacts with conductor to produce detectable secondary particles from which the voltage on conductor 420 can be determined. Such probe systems are well-known in the art and some are commercially available, such as the IDS 5000 electron-beam prober available from Schlumberger Technologies, San Jose, Calif.

Figure 4B:
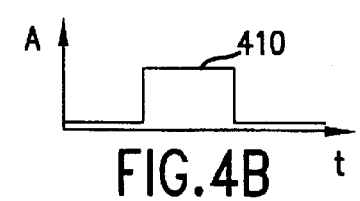
FIG. 4B is an exemplary waveform image acquired from probing of an exposed conductor as in FIG. 4A.

FIG. 4B is an exemplary waveform image acquired from probing of an exposed conductor as in FIG. 4A. The detected waveform 410 contains information about the magnitude and timing of the signal appearing on conductor 120 as the IC device is stimulated. Accurate timing information is available. Bandwidth is limited only by available technology.

The precise sequence of operations may vary from that of FIGS. 1A, 2A, 3A and 4A if desired. For example, some IC device manufacturers use heavily-doped silicon substrates that are not very transparent even for light in the IR wavelengths. In this case, it may be preferable to vary the sequence so as to laser-mill window 205 as in FIG. 2A before preparing an IR optical microscope image. Laser milling can be performed as in FIG. 2A, followed by preparation of an IR optical microscope image which would appear as in FIG. 2B.

Alignment of the IR optical image to the CAD layout data for the IC device can be performed as described above with reference to FIG. 1B. To precisely navigate the F1B relative to structural features of the IC as in FIG. 3A, alignment with the coordinate system of the FIB milling system must also be assured. An IR optical microscope image containing features which can be aligned with the CAD layout data (such as edges of conductor 120) and containing features which can be aligned with a FIB image (such as edges 215, 220 and 225) is used to assure the alignment. While a FIB image of the back side of the substrate will not show structural features (such as conductor 120) before FIB milling is conducted, it will show topographical features (such as edges 215, 220 and 225) produced by the laser milling. Such topographical features can be used to align the FIB image, and thus the coordinate system used for FIB navigation, with the IR optical image. Linking the CAD layout data, the IR optical image and a FIB image in this way allows the FIB to be navigated precisely to any IC feature (such as conductor 120) which is visible in a CAD layout image or the IR optical microscope image, even though the feature is not visible in the FIB image. Any feature which is visible in both the IR optical image and a FIB image may be used to align the two images. The feature may be a hole milled with a FIB or may be one or more marks drilled in the substrate with a laser to provide alignment before other features of the device are visible in a FIB image.

FIG. 5 is a schematic, sectional view showing IR optical microscope imaging and laser thinning of the substrate 500 of a device to identify alignment points and features of interest. Substrate 500 is first thinned to a thickness 505 of about 100 μm to 200 μm by mechanical polishing or other suitable process. One or more holes or marks or windows or other topological features, such as window 510, is cut into the back side of substrate 500, preferably by laser milling. An IR optical microscope 515 is operated to acquire images of the IC device at various regions of interest, such as regions 520, 525, 530 and 535. At least one of these images includes a topographical feature or features cut into the back side of substrate 500, such as window 510. The IR optical miscroscope images are stored, along with coordinate information from which their positions relative to one another can be determined. If desired, multiple regions of substrate 500 can be thinned by cutting windows such as window 510, preferably without entering the layer 512 of active regions such as active regions 540 and 545. Features of interest, such as conductors 550, 555, 560 and 565 are visible in the IR optical microscope images, as are edges of the windows milled in the back side of the substrate, such as edges 570, 575 and 580 of window 510. The IR optical microscope images and their relative position information are stored and transferred to a FIB milling system along with the IC device.

FIG. 6 is a schematic, sectional view showing FIB milling to expose features to be used as alignment points for further FIB milling in the device of FIG. 5. To minimize risk of damage to active areas, FIB milling can first be carried out to expose features which are not located near active regions or other structure susceptible to damage, such as conductors 550 and 555. The features thus exposed can be FIB-imaged and used to align the stored IR optical microscope images and the CAD layout data with the coordinate system of the FIB milling system. After performing this alignment, FIB milling can be reliably performed to expose other features of interest, such as conductors 560 and 565, without risk of damage to adjacent structures, such as active regions 540 and 545.

FIGS. 7A–7C illustrate one possible alignment method in accordance with the invention. FIG. 7A is CAD image 700 of a portion of an IC device showing conductors 705 and 710 of interest. FIG. 7B is an IR optical microscope image 715 of a portion of the IC device of FIG. 7A showing conductors 705 and 710 of interest and showing the edges 720, 725 and 730, 735 of windows 740 and 745 where the substrate has been thinned by laser milling. FIG. 7C is a FIB image 750 of a portion of the IC device of FIG. 7A showing the edges 720, 725 and 730, 735 of windows 740 and 745, and showing exposed portions of conductors 705 and 710 where substrate material has been removed by FIB milling. The CAD layout and IR optical images can be aligned with one another using selected alignment points visible in the CAD layout and in the IR optical microscope images, such as points 755, 760 and 765. When the IC device and the IR optical microscope images have been transferred to the FIB milling system, the FIB system is first used to acquire a FIB image of the back side of the substrate in which the edges of windows 740 and 745 are visible (conductors 705 and 710 are not yet visible in the FIB image). Alignment points common to the IR optical microscope image and to the FIB image, such as corners 570, 575 and 580 of windows 540 and 545, are selected and used to align the images. Once the CAD layout, IR optical and FIB images are aligned, a feature visible on the CAD layout image or IR optical image can be used to navigate the FIB to a feature not visible in the FIB image. FIB milling is then carried out to expose a hidden feature, such as conductor portion 705 shown in FIG. 7C. If desired, a FIB image can then be acquired which shows the exposed feature, and one or more further alignment points, such as point 755 in FIG. 7C, can be selected to directly align the FIB image with the CAD layout. Further FIB milling can be conducted to expose conductor portion 710 as shown in FIG. 7C.

Figure 8A:
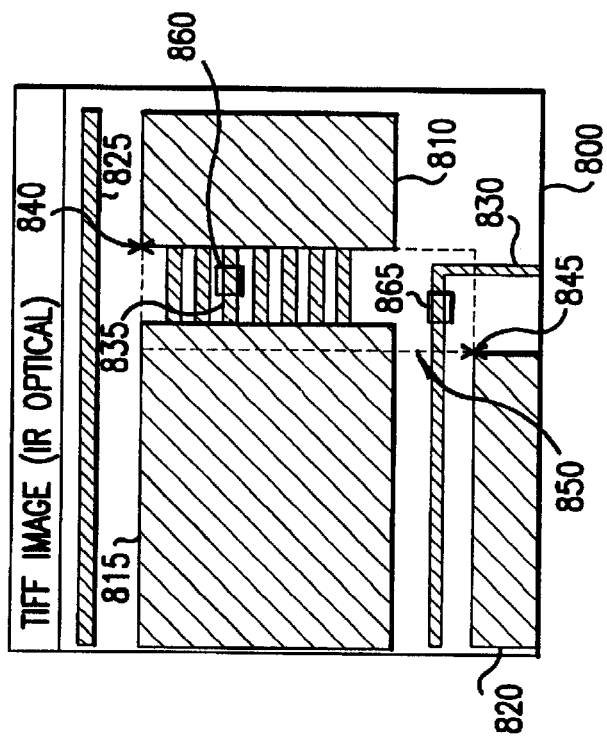
FIGS. 8A and 8B are respective exemplary IR optical microscope and FIB images used to register a FIB milling apparatus with buried structure of an IC device.
Figure 8B:
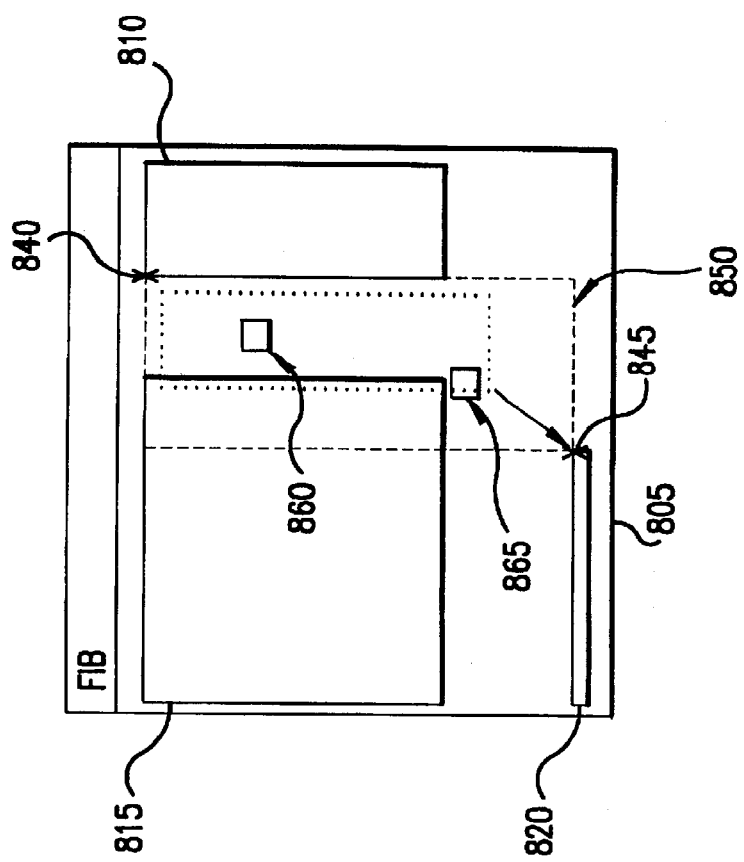

FIGS. 8A and 8B are respective exemplary IR optical microscope and FIB images 800 and 805 used to register a FIB milling apparatus with buried structure of an IC device. Visible in both images are edges 810, 815 and 820 of windows laser-milled into the back side of the substrate. Visible in FIG. 8A are features such as conductors 825, 830 and 835. Points have been selected and used to align the two images. Note, however, that the mutually-aligned images are not to the same scale. Corner points 840 and 845 define a FIB box registration area 850 on image 800 which is scaled to correspond with area 850 on image 805. Using the software navigation tools provided on the Schlumberger IDS P2X system to place FIB operations boxes 860 and 865 on the IR optical image, corresponding FIB operations boxes are automatically placed at the equivalent locations on the FIB image. The boundaries of these boxes are thus known to the FIB system within its own coordinate system and are used to directed the FIB to expose conductors 835 and 830 at the indicated locations.

FIG. 9 is a partial sectional view of a flip-chip packaged part 900, showing solder-bump connections, such as connections, 905 and 910 from chip 915 to package 920 and showing above dotted line 930 those portions of the chip and package to be removed for back side investigation in accordance with the invention. The initial thickness 935 of chip 915 will be reduced to thickness 940 by mechanical polishing or the like before beginning laser milling operations. For added mechanical strength, a non-conductive epoxy or other bonding material may be injected between chip 915 and package 920 between the solder-bump connections. A suitably-selected bonding material may also assist in heat transfer from the device during debug, when the device is stimulated to conduct probing operations as described above. FIG. 10 is a front view of a bond pad 945 of chip 915 and a solder bump connection 905 of a kind typically found in flip-chip packaged devices.

FIGS. 11A–11C illustrate a method of displaying the acquired images to assist in FIB milling operations. FIG. 11A is an IR optical microscope image 1100 of a portion of an IC device showing a conductor of interest 1105. By suitable processing of image 1100, a derivative image 1110 is produced in which the edges 1115 and 1120 of conductor 1105 are enhanced, as shown in FIG. 11B. Edge-enhancement techniques are known, for example, from the above-reference European Patent Publication of Barnard.

FIG. 11C is a FIB image 1125 of the IC device portion of FIG. 11A on which edges 1115 and 1120 of FIG. 11B and a FIB operation box 1130 are overlaid to show where the device is to be milled to expose a feature of interest such as conductor 1105. A representation 1135 of a portion conductor 1105 from the CAD data file can also be overlaid on the image if desired, to indicate orientation of the conductor within the FIB operations box.

Figure 12:
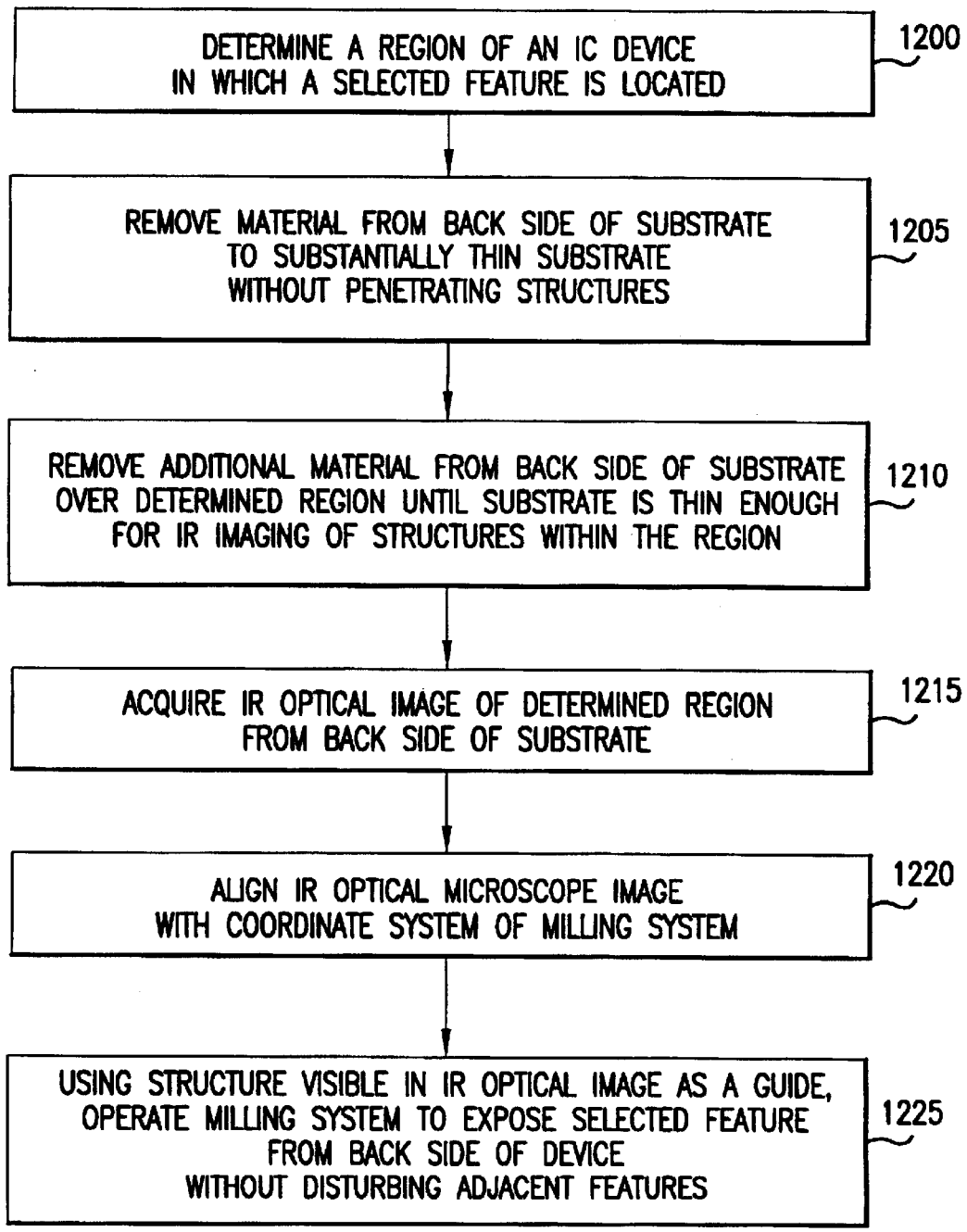
FIG. 12 is a representative flow chart showing a possible series of steps in accordance with the invention.

FIG. 12 is a representative flow chart showing one possible series of steps in accordance with the invention. While the precise sequence and number of steps can be varied, the sequence of FIG. 12 is illustrative. In step 1200, a region of an IC device is determined in which a selected feature is located. In step 1205, material is removed from the back side of the substrate to substantially thin the substrate without penetrating structures, e.g., as described below with reference to FIGS. 1–5. In step 1210, additional material is removed from the back side of the substrate over the determined region until the substrate is thin enough for IR imaging of structures within the region, e.g., as in FIG. 2A. In step 1215, an IR optical microscope image of the determined region is acquired from the back side of the substrate, e.g., as in FIG. 2B. In step 1220, the IR optical microscope image is aligned with the coordinate system of a milling system such as a FIB milling system, e.g., as described above with reference to FIGS. 7A–7C. In step 1225, structures visible in the IR optical image are used as a guide to operate the milling system to expose the selected feature from the back side of the device without disturbing adjacent features, e.g., as in FIG. 3A.

Figure 13:
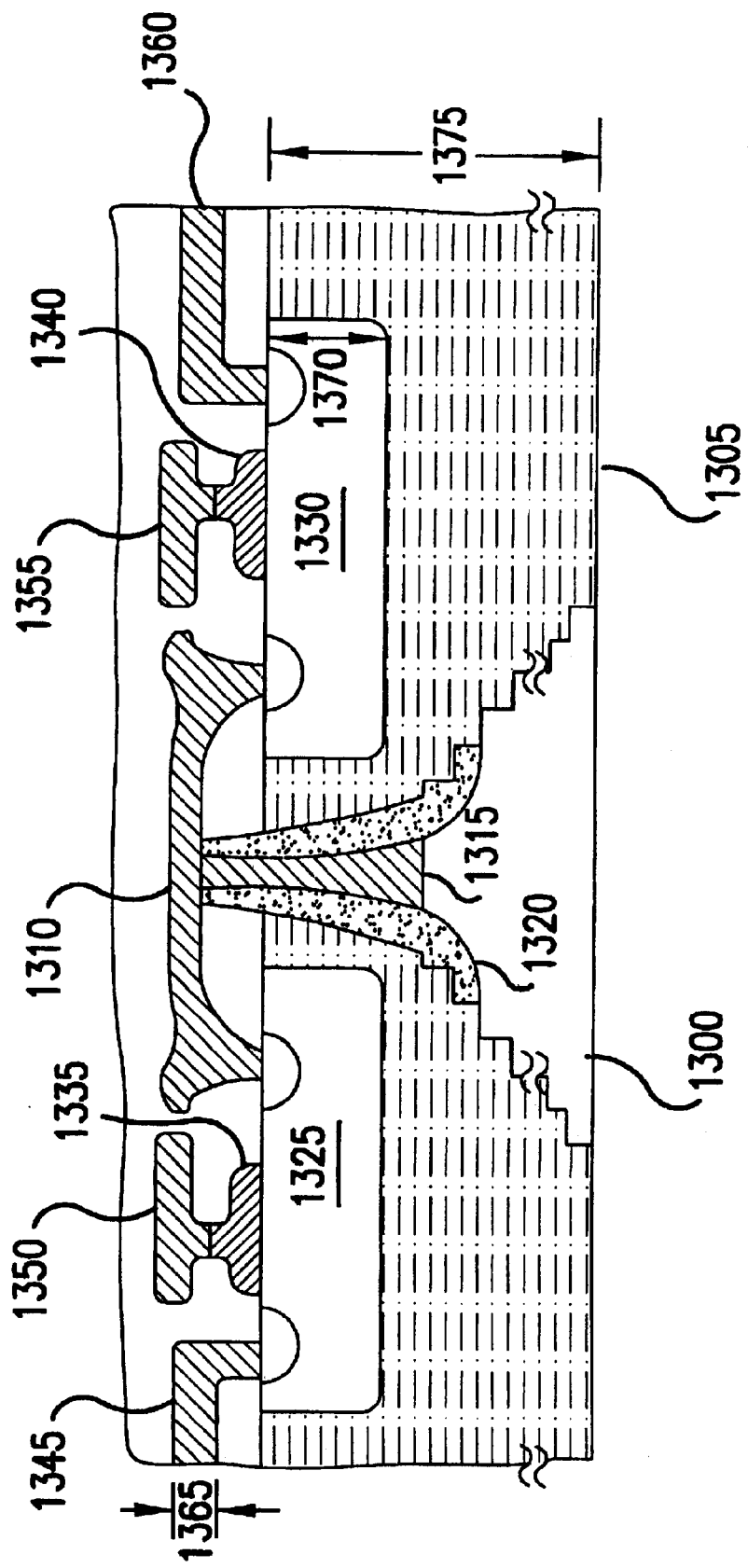
FIG. 13 shows a partial sectional view of an IC device processed in accordance with the invention to install a probe pad through the back side of the substrate.

FIG. 13 shows a partial sectional view (not to scale) of an IC device processed in accordance with the invention to install a probe pad through the back side of the substrate. In this case, a window 1305 has been milled through the back side of substrate 1305 using the techniques described above, to expose a portion of conductor 1310. The window is then filled with metal to produce a conductive pad 1315 in electrical contact with conductor 1310. Techniques for FIB deposition of conductive material are known, for example, from U.S. Pat. No. 5,104,684 to Tao et al. (deposition of platinum) and U.S. Pat. No. 5,025,664 to Hongo et al. (deposition of tungsten and other metals). To prevent shunting of the signal from conductor 1310 to substrate 1305, it is preferred to line the opening with insulative material 1320, then mill again with the FIB to expose the conductor before deposition of conductive material. Techniques for FIB-assisted deposition of insulative material are described, for example, in co-pending U.S. patent application Ser. No. 08/434,548, filed May 4, 1995.

Also visible in FIG. 13 are diffusion regions 1325 and 1330, polysilicon gates 1335 and 1340, and conductors 1345, 1350, 1355 and 1360 of metal layer 1365. Diffusion regions 1325 and 1330 typically have a depth 1370 of less than 5 $\mu$m, whil substrate 1305 typical has (or prior to milling window 1300 is reduced to) a thickness 1375 on the order of 200 $\mu$m in the region where the window 1300 is to be milled.

Figure 14:
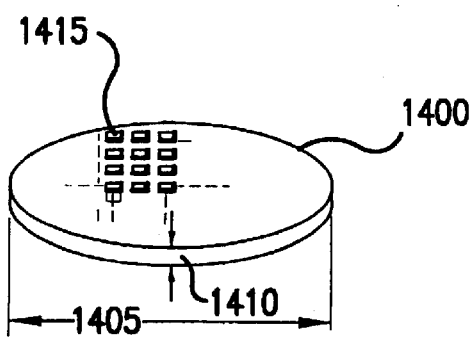
FIG. 14 shows a perspective view of a typical 8-inch diameter wafer.

FIG. 14 shows a perspective view of a typical silicon wafer 1400 having a diameter 1405 of 8 inches and a thickness 1410 of about 800 $\mu$m. Fabricated on the front side of wafer 1400 is an array of IC devices such as device 1415. Layers deposited on the wafer during fabrication of the IC devices may add about 10 $\mu$m to the overall thickness.

Figure 15:
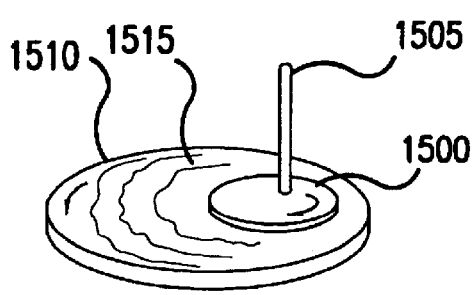
FIG. 15 shows a perspective view of an arrangement for thinning the substrate of a wafer.

FIG. 15 is a schematic, perspective view of an arrangement for thinning the substrate of a wafer 1500. The wafer is held, for example by a vacuum chuck 1505 or other means and the back side of the wafer is rotated against a polishing wheel 1510 coated with a polishing material such as the mica slurry used in conventional CMP (chemical mechanical polishing) processes.

Figure 16:
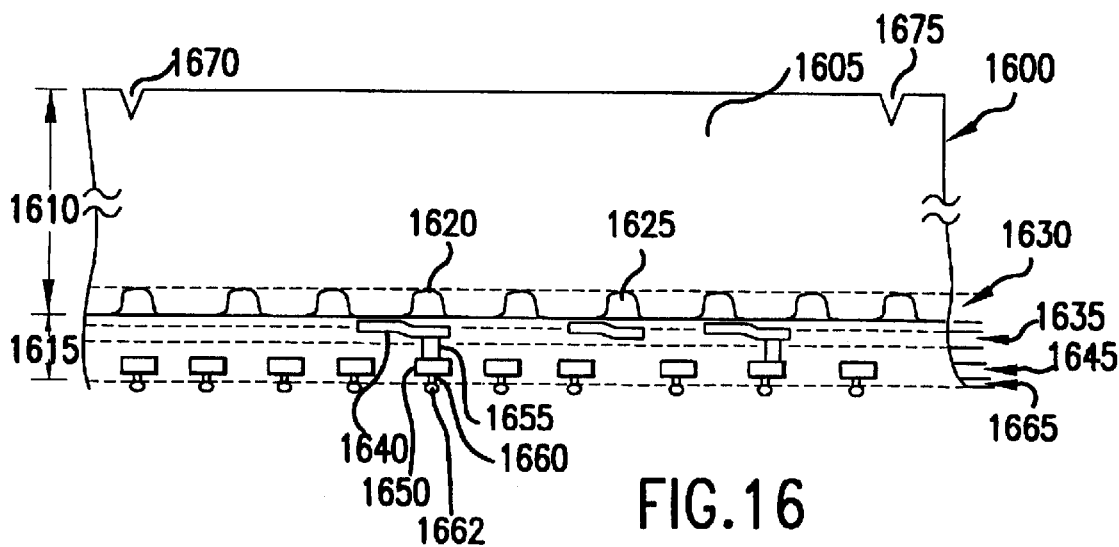
FIG. 16 shows a partial cross-sectional view of an unthinned wafer.

FIG. 16 shows a partial, sectional view of a typical wafer 1600. prior to thinning of silicon substrate 1605 by mechanical polishing or other suitable process. Wafer 1600 has a substrate thickness 1610 of about 800 $\mu$m and an interconnect layer thickness 1615 of about 10 $\mu$m. Active regions, such as wells 1620 and 1625, are diffused into the front face of substrate 1605 to some depth 1630. Polysilicon gates are provided in a layer 1635 near substrate 1605, such as polysilicon gate 1640. A metal interconnect layer 1645 includes conductors such as a conductive trace 1650. Conductive vias connect the gates to the conductors, such as via 1655 connecting gate 1640 to conductor 1650. Signals on the conductors are carried to the package (not shown) by vias and solder bumps, such as via 1660 and solder bump 1662. A passivation layer 1665 of silicon dioxide is applied over metal interconnect layer 1645. Accessing conductors of layer 1645 through the back side of substrate 1605 is difficult at best, because of the risk of damage to active regions of layer 1630 and the lack of fiducial marks or other indicia on the back side of substrate 1605 to aid in precise navigation to the location of a specific conductor such as conductor 1660.

Figure 17:
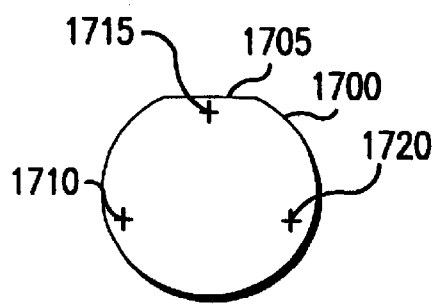
FIG. 17 shows a wafer having a flat edge and fiducial marks on its front side useful for navigation.
Figure 18:
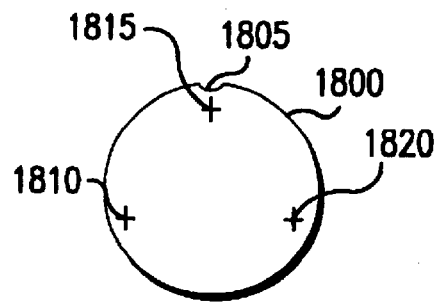
FIG. 18 shows a wafer having a notched edge and fiducial marks on its front side useful for navigation.

FIG. 17 shows a wafer 1700 having a flat edge 1705 and fiducial marks 1710, 1715, 1720 on its front side useful for navigation to specific locations on the wafer. FIG. 18 shows a wafer 1800 having a notched edge 1805 and fiducial marks 1810, 1815, 1820 on its front side useful for navigation to specific locations on the wafer. As such fiducial marks are produced on the front side of the wafer during fabrication, they are not suitable for navigation when accessing conductors through the back side of the wafer. While a flat edge 1705 or notch 1805 can be used for "blind" navigation from the back side of the wafer, it is not adequate for precise navigation of a milling apparatus to a specific conductor without risk of damage to surrounding structure. More precise information about the location of structure fabricated on the wafer is needed, and can be provided by marking the back side of the substrate in accordance with the invention, e.g., by laser-milling or FIB-milling of marks such as marks 1670 and 1675 shown in FIG. 16. Such marks can be used to align an IR optical image acquired through the backside of the substrate with a FIB image, since the marks are visible in both types of image.

Alignment of a FIB image with an IR optical image must take into account differing resolution of the images. FIB image resolution is limited by the spot size of the FIB used to acquire the image, and can be less than 10 nm in current commercial systems such as the Schlumberger P2X system. Optical image resolution is fundamentally limited by diffraction to 0.25–0.5 µm, and is governed by the relation $$d*\sin(\Theta) = n*\lambda$$

where d is the spatial period, $\Theta$ is the semi-aperture angle, n, order=1, and $\lambda$ is the wavelength in the imaging medium. Advanced semiconductor linewidths are typically today 0.35–0.5 µm. That is, the optical image will be blurred by diffraction. The FIB image will have significantly better resolution than the optical image.

Because of differing resolution, an optical image cannot be aligned with a FIB image on a simple pixel-by-pixel basis with sufficient accuracy to reliably locate typical signal lines of minimum dimension. One way of enabling image alignment is to use sub-pixel interpolation to infer the location in the optical image of features which are unambiguous in the higher-resolution FIB image. The principle is illustrated in FIGS. 19A, 19B and 19C. FIG. 19A shows a through-the-backside optical image 1900 of a device in which conductive signal traces 1905, 1910 and 1915 are visible. Line 1920 represents the position of a row of pixels of optical image 1900. FIG. 19B shows a FIB image 1930 of the same device in which a portion of the detail region 1925 is visible (e.g., through a window in the substrate of the device). Visible in image 1930 are portions of conductors 1905, 1910 and 1915. Line 1935 represents a row of pixels of FIB image 1930, of higher resolution than optical image 1900.

FIG. 19C shows the relative spacing and intensity of pixels of optical image 1900 along line 1920, including pixels 1940, 1945, 1950, 1955, 1960, 1965 and 1970. To infer the locations of the edges of conductors 1905 and 1910, the pixel intensity is thresholded at a suitable level 1975, and the position of each conductor edge is interpolated as shown in FIG. 19C. For example, if threshold 1975 lies midway between the intensity values of adjacent pixels 1940 and 1945, then the left edge of conductor 1905 is inferred to be midway between the locations of pixels 1940 and 1945.

Those of skill in the art will recognize that these and other modifications can be made within the spirit and scope of the invention as defined in the claims which follow.

What is claimed is:

1. A method of exposing a selected feature of an IC (integrated circuit) device without disturbing adjacent features of the IC device, the IC device having a silicon substrate with a front side and a back side and having on the front side a plurality of structures defining said features, comprising:
   a. acquiring from the back side of the substrate an IR optical microscope image of a region of the IC device in which the selected feature is located;
   b. aligning the IR optical microscope image with a coordinate system of a milling system; and
   c. using structures visible in the IR optical microscope image as a guide, operating the milling system to expose the selected feature from the back side of the IC device without disturbing adjacent features.

2. The method of claim 1, further comprising the step, prior to acquiring an IR optical microscope image, of removing material over said region until the subtrate is sufficiently thinned to enable IR (infrared) imaging of structures within said region.

3. The method of claim 2, wherein removing material from the back side of the substrate comprises removing material from the back side of the substrate to substantially thin the substrate without penetrating into structures which define features of the IC device.

4. The method of claim 2, wherein removing material from the back side of the substrate comprises mechanical removal of material by lapping or grinding.

5. The method of claim 2, wherein removing material from the back side of the substrate comprises chemical removal of material.

6. The method of claim 2, wherein removing material from the back side of the substrate comprises thinning the substrate to a thickness of about 100 µm to about 200 µm.

7. The method of claim 2, wherein removing material from the back side of the substrate comprises polishing the substrate sufficiently to remove surface irregularities which may be visible in an IR optical microscope image of said region.

8. The method of claim 2, wherein removing material from the back side of the substrate comprises scanning a laser beam directed at the back side of the substrate over said region.

9. The method of claim 2, wherein removing material from the back side of the substrate comprises scanning an Argon-ion laser beam directed at the back side of the substrate over said region, and assisting removal of material by introducing a halogen or halogen-containing compound.

10. The method of claim 2, wherein removing material from the back side of the substrate comprises removing said material so as to create topological features on the back side of the substrate, and wherein step a. comprises acquiring an IR optical microscope image of said region which includes said topological features.

11. The method of claim 10, wherein said topological features comprise edges of an opening cut into the back side of the substrate by removal of said material.

12. The method of claim 10, wherein the milling system comprises a FIB (focused ion beam) system, and wherein step b. comprises:

i. acquiring a FIB image of the back side of the device in which said topological features are visible, ii. selecting a plurality of points on the IR optical microscope image and a corresponding plurality of points on the FIB image, and iii. aligning the selected points on the IR optical microscope image with the corresponding points of the FIB image.

13. The method of claim 12, wherein step c. comprises operating the FIB system to mill an opening through the back side of the IC device.

14. The method of claim 12, wherein the IC device comprises a multi-layered device having an active-region layer containing a plurality of spaced-apart active regions and a metal layer containing conductive traces which pass between the active regions, the metal layer being more distant from the front side of the substrate than the active-region layer, and wherein step c. comprises operating the FIB system to mill an opening through the back side of the IC device and between active regions of the active-region layer to expose a conductive trace of the metal layer without disturbing the active regions.

15. The method of claim 14, wherein step c. further comprises introducing a halogen-containing compound during milling to selectively enhance the milling of material other than metal.

16. The method of claim 14, further comprising the steps of applying stimulus to the IC device to cause a signal to appear on the exposed conductive trace, and probing the conductive trace to detect the signal on the exposed conductive trace.

17. The method of claim 14, wherein the milling system comprises a FIB system and wherein step b. comprises i. operating the FIB system to mill through the substrate from the back side to expose features of the IC suitable for alignment of a FIB image of the IC device with the IR optical microscope image, ii. acquiring a FIB image of the back side of the IC device in which the exposed features are visible, iii. selecting a plurality of points on the IR optical image corresponding to the exposed features visible in the FIB image, and iv. aligning the selected points on the IR optical microscope image with the corresponding exposed features visible in the FIB image.

* * * * *